(12) United States Patent
Wu

(10) Patent No.: US 7,049,205 B2
(45) Date of Patent: May 23, 2006

(54) STACKED CAPACITOR AND METHOD FOR PREPARING THE SAME

(75) Inventor: Hsiao Che Wu, Jhongli (TW)

(73) Assignee: Promos Technologies Inc., Hsinchu (TW)

( * ) Notice: Subject to any disclaimer, the term of this patent is extended or adjusted under 35 U.S.C. 154(b) by 0 days.

(21) Appl. No.: 10/971,133

(22) Filed: Oct. 25, 2004

(65) Prior Publication Data

US 2006/0086962 A1 Apr. 27, 2006

(51) Int. Cl.
*H01L 21/20* (2006.01)

(52) U.S. Cl. ...................................................... 438/396
(58) Field of Classification Search ................ 438/3, 438/238, 239, 240, 253, 254, 255, 396–399, 438/381; 257/303, 306, E21.648
See application file for complete search history.

(56) References Cited

U.S. PATENT DOCUMENTS 6,821,837 B1 * 11/2004 Lian ........................... 438/236
2004/0036051 A1 * 2/2004 Sneh ........................... 251/301

* cited by examiner

*Primary Examiner*—W. David Coleman
*Assistant Examiner*—Phillip Green
(74) *Attorney, Agent, or Firm*—Oliff & Berridge, PLC

(57) ABSTRACT

The present invention discloses a stacked capacitor having interdigital electrodes and method for preparing the same. The stacked capacitor comprises a first interdigital electrode, a second interdigital electrode and a dielectric material sandwiched between the first interdigital electrode and the second interdigital electrode. The first and the second interdigital electrodes comprise a body and a plurality of fingers electrically connected to the body, and the dielectric material can be silicon nitride or silicon oxide. Preferably, fingers of the first interdigital electrode are made of titanium nitride, while fingers of the second interdigital electrode are made of polysilicon. The body of the first and the second interdigital electrodes are preferably made of titanium nitride.

13 Claims, 11 Drawing Sheets

STACKED CAPACITOR AND METHOD FOR PREPARING THE SAME

BACKGROUND OF THE INVENTION (A) Field of the Invention

The present invention relates to a stacked capacitor and method for preparing the same, and more particularly, to a stacked capacitor having interdigital electrodes and method for preparing the same.

(B) Description of the Related Art

DRAM is a widely used integrated circuit device. With the development of the semiconductor industry, there is an increasing demand for DRAM with higher storage capacity. The memory cell of DRAM consists of a Metal-Oxide-Semiconductor (MOS) transistor and a capacitor electrically connected to each other. The capacitor functions to store the electric charge representing data, and high capacitance is necessary to prevent the data from being lost due to discharge. The method to increase electric charge storing capacity of the capacitor can be achieved by increasing the dielectric constant of the dielectric material and reducing the thickness of the dielectric material used in the capacitor, as well as increasing surface area of the capacitor. However, with the advancement of semiconductor technology proceeds into sub-micron and deep sub-micron, the traditional fabrication process for preparing the capacitor is no longer applicable. Consequently, researchers are trying to develop dielectric material with a higher dielectric constant and to increase surface area of the capacitor so as to increase the capacitance.

SUMMARY OF THE INVENTION

The objective of the present invention is to provide a stacked capacitor having interdigital electrodes and method for preparing the same.

In order to achieve the above-mentioned objective and avoid the problems of the prior art, the present invention discloses a stacked capacitor having interdigital electrodes and method for preparing the same. The stacked capacitor comprises a lower interdigital electrode, an upper interdigital electrode and a dielectric material sandwiched between the lower interdigital electrode and the upper interdigital electrode. Both the lower and the upper interdigital electrodes comprise a body and a plurality of fingers electrically connected to the body, and the dielectric material can be silicon nitride or silicon oxide. Preferably, fingers of the lower interdigital electrode are made of titanium nitride, and fingers of the upper interdigital electrode are made of polysilicon. The body of the upper interdigital electrode is made of titanium nitride, and the finger is made of polysilicon.

The present method for preparing a stacked capacitor first forms a trench in a substrate and a plurality of stacked capacitive structures on the substrate, wherein the capacitive structure includes a first conductive layer, a first dielectric layer and a second conductive layer. A second dielectric layer is deposited on the surface of the capacitive structures in the trench, and an etching process is then performed to remove a portion of the second dielectric layer and the capacitive structures in the trench so as to form an opening in the trench. The second conductive layer in the opening is electrically isolated, and a third conductive layer is subsequently formed in the opening to electrically connect the first conductive layers in the opening. The second conductive layers on the surface of the substrate are then exposed, and a fourth conductive layer is deposited on the surface of the substrate to electrically connect the second conductive layers.

BRIEF DESCRIPTION OF THE DRAWINGS

Other objectives and advantages of the present invention will become apparent upon reading the following description and upon reference to the accompanying drawings in which.

DETAILED DESCRIPTION OF THE INVENTION

Figure 1:
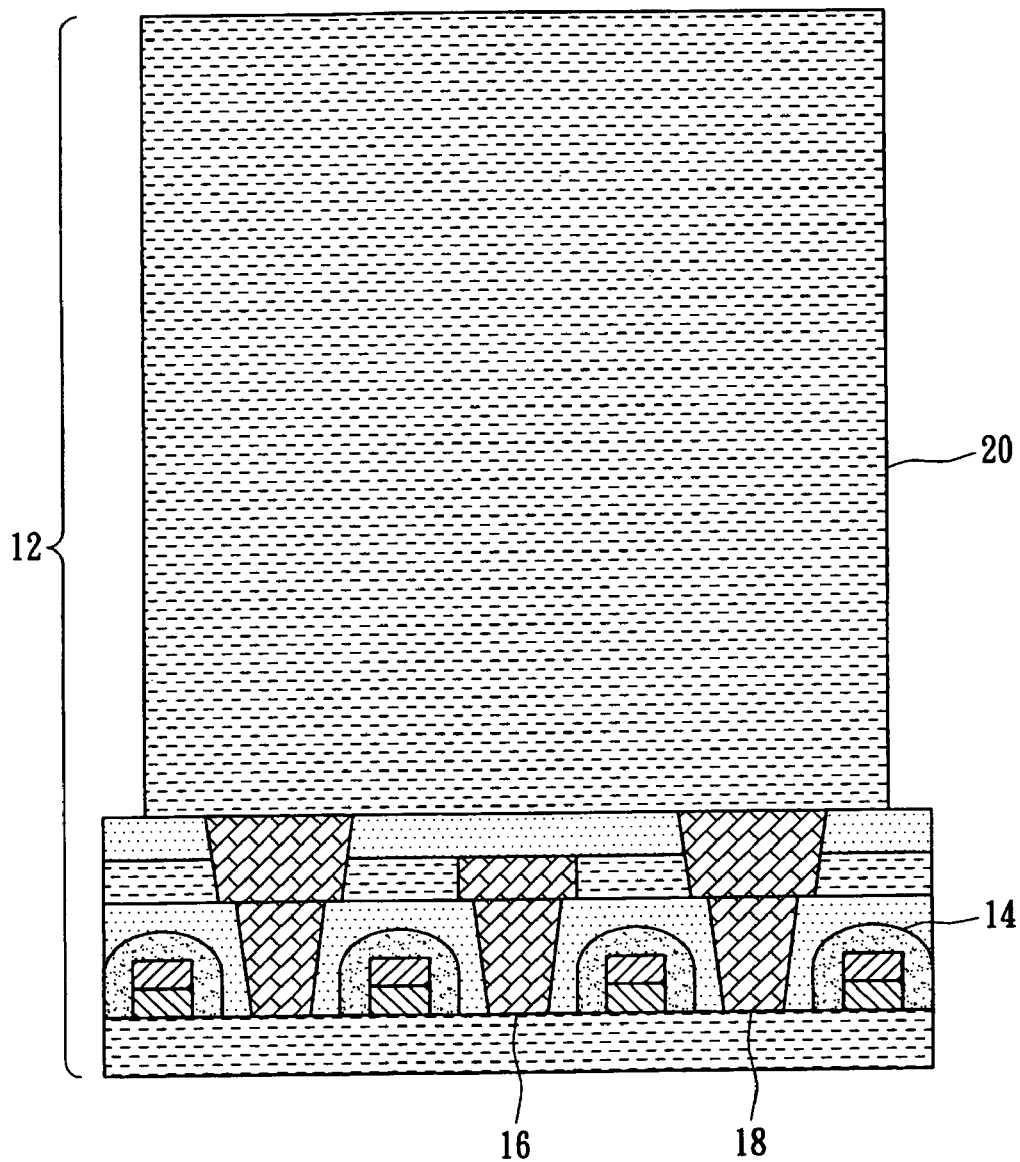
FIG. 1 to FIG. 10 show the method for preparing a stacked capacitor according to the present invention.
Figure 2:
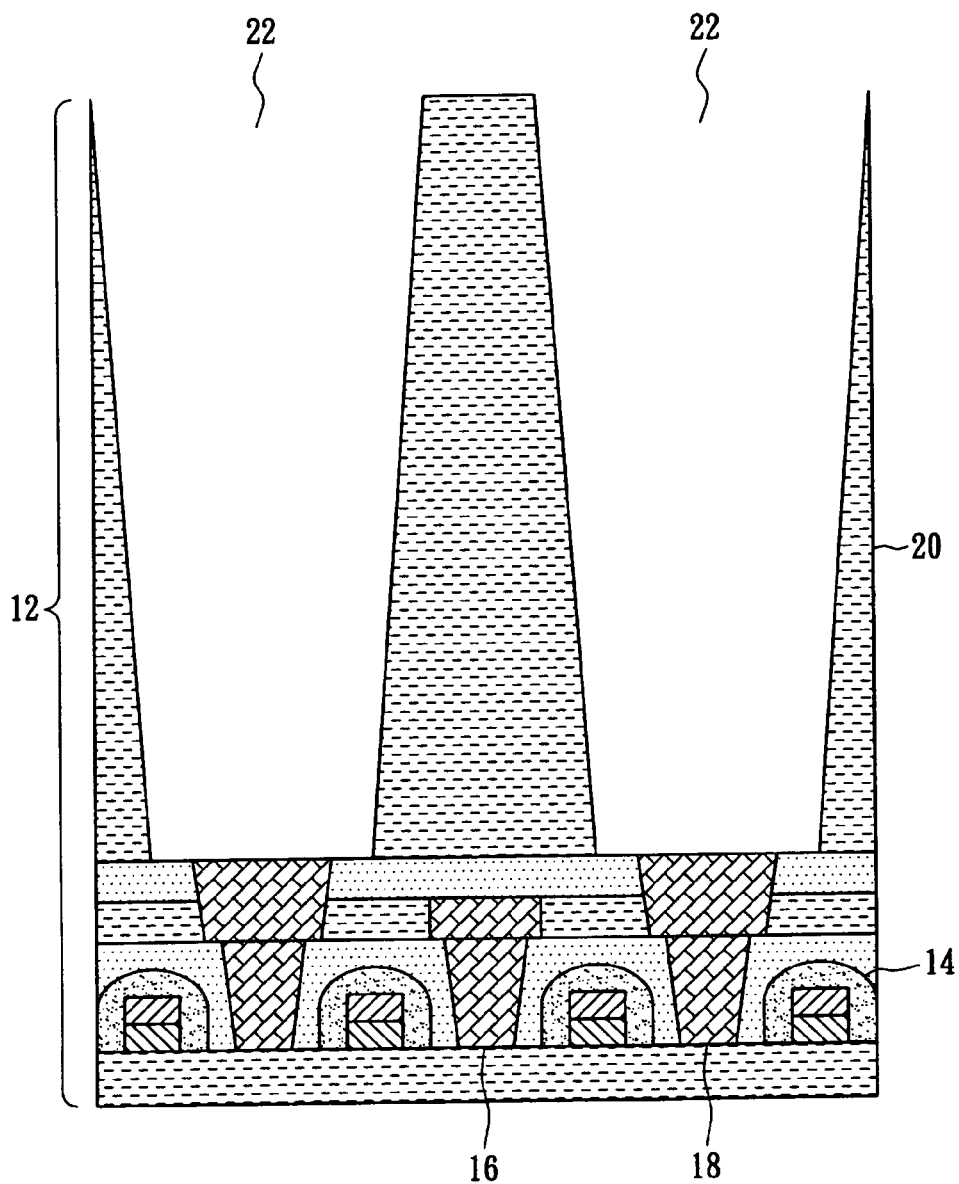
Figure 9:
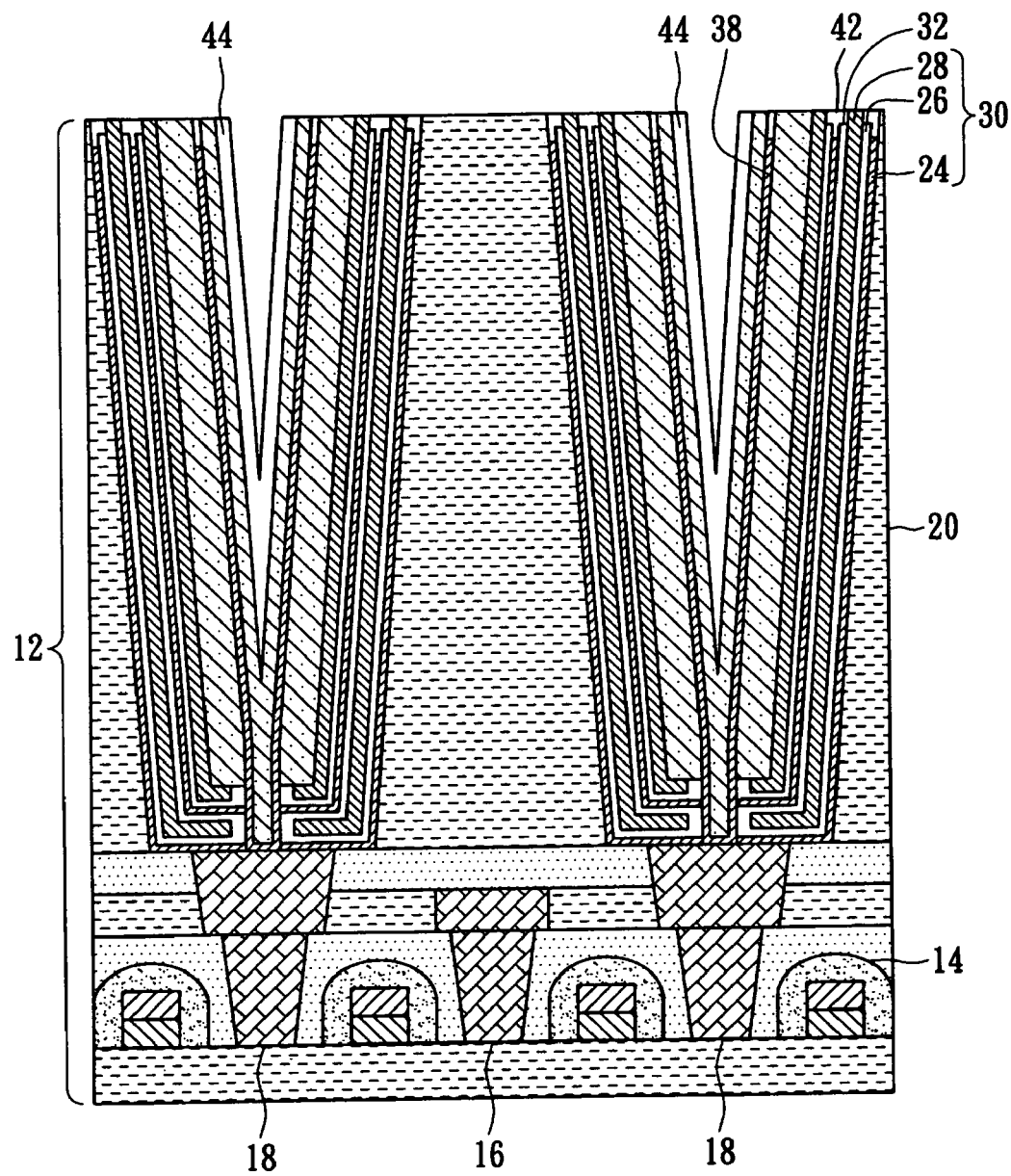
Figure 10:
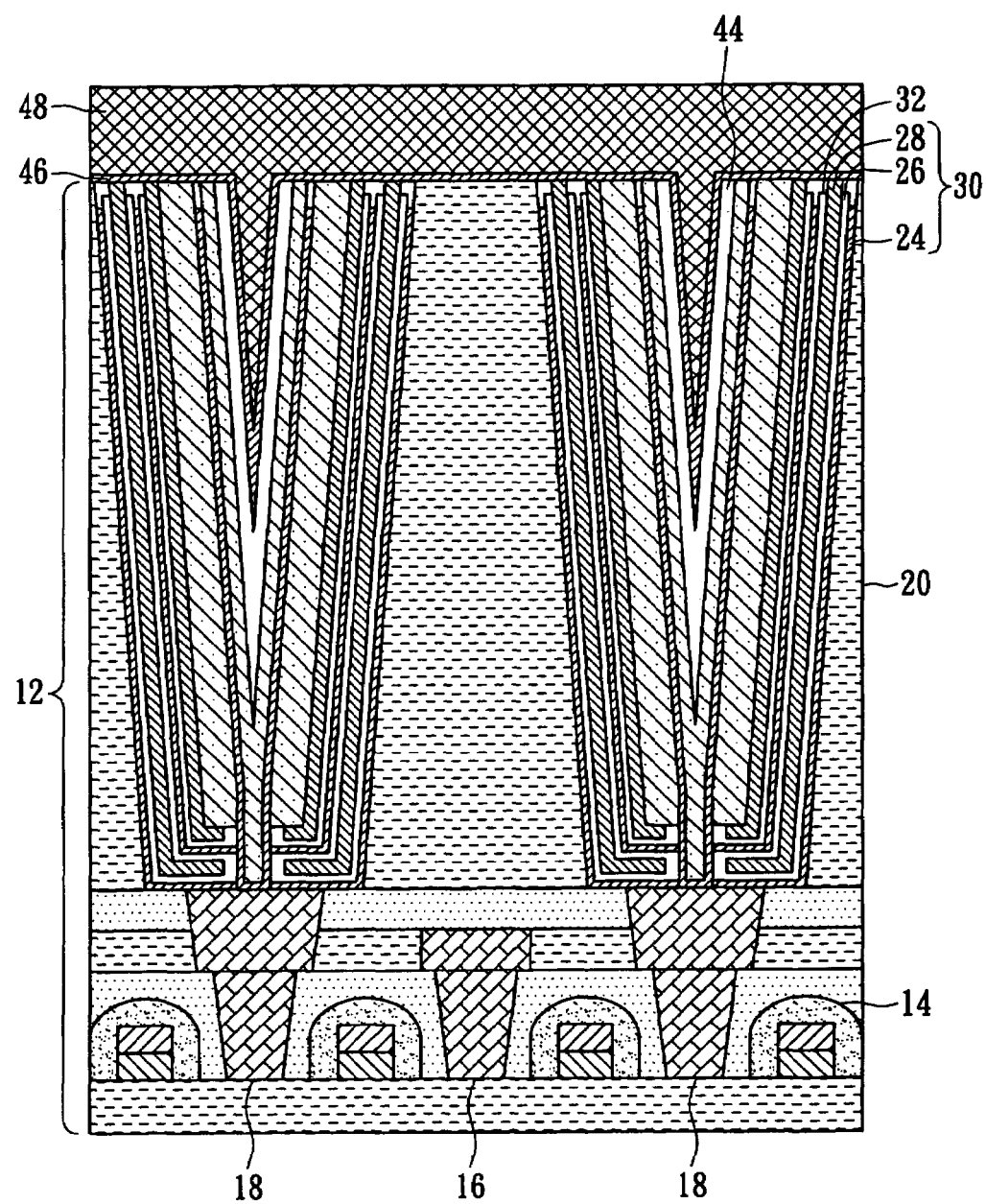
Figure 11:
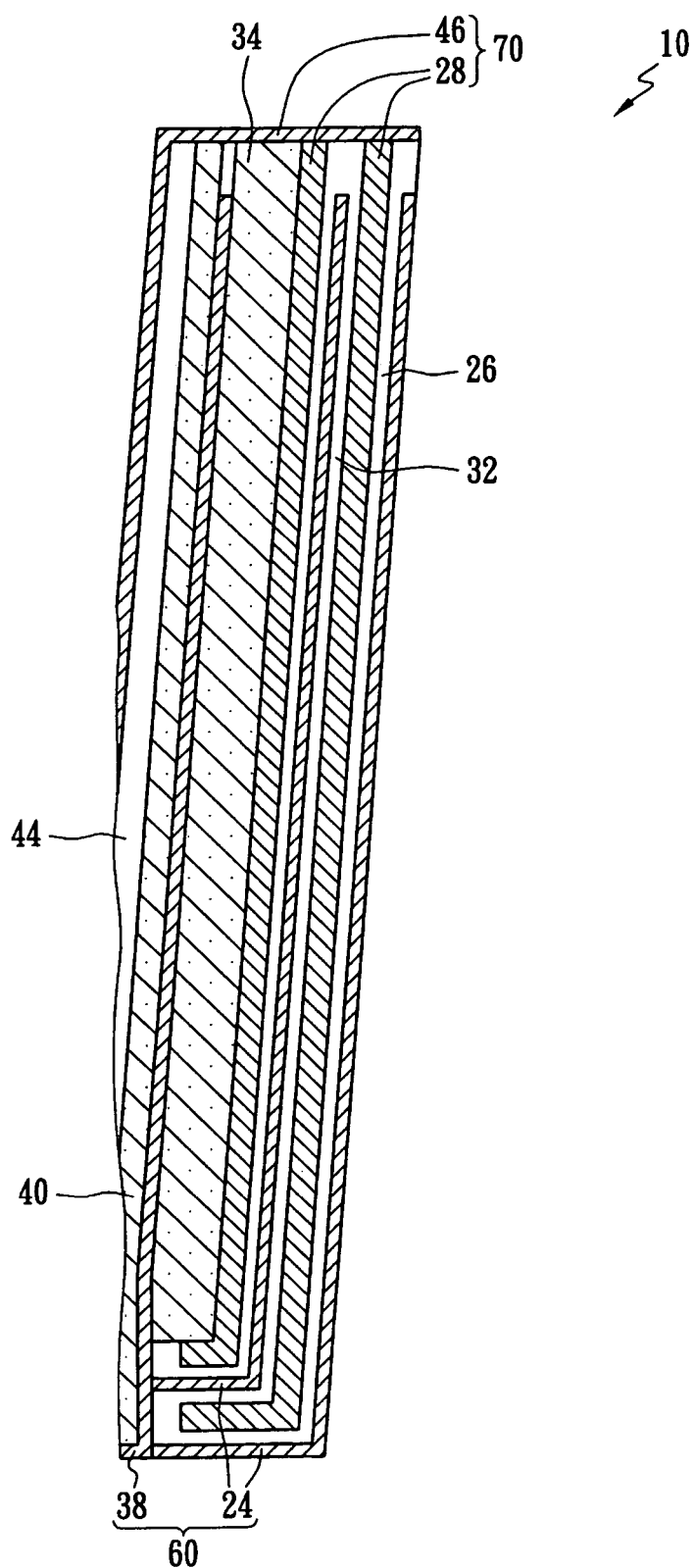
FIG. 11 is a close-up diagram of a stacked capacitor according to the present invention.

FIG. 1 to FIG. 10 illustrate a method for preparing a stacked capacitor 10 and FIG. 11 is a close-up diagram of the stacked capacitor 10 according to the present invention. As shown in FIG. 1, the present invention prepares a substrate 12, which includes four gate structures 14, a bit-line contact plug 16, two capacitor contact plugs 18 and a dielectric layer 20. A photolithographic process and an etching process are performed to form trenches 22 in the dielectric layer 20, wherein the trench 20 exposes the capacitor contact plug 18, as shown in FIG. 2.

Figure 3:
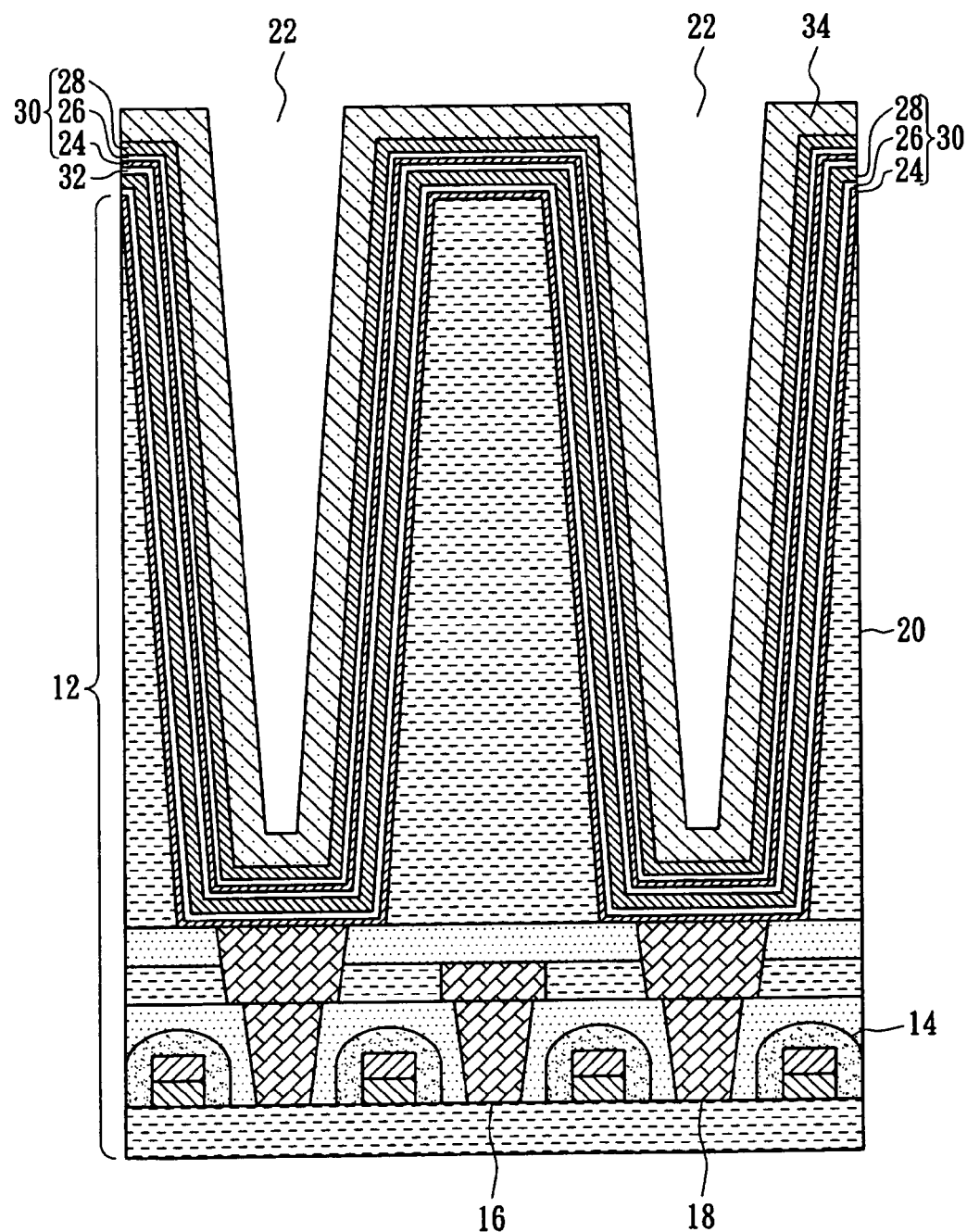

Referring to FIG. 3, a deposition process is performed to form two stacked capacitive structures 30 on the substrate 12, and a dielectric layer 32 sandwiched between the two capacitive structures 30, wherein the capacitive structure 30 comprises a conductive layer 24, a dielectric layer 26 and a conductive layer 28. A dielectric layer 34 is then deposited on the surface of the capacitive structure 30. The conductive layer 24 is a titanium nitride layer formed by atomic layer deposition, both the dielectric layer 26 and the dielectric layer 32 are silicon nitride layer formed by atomic layer deposition or chemical vapor deposition, and the conductive layer 28 is a polysilicon layer formed by epitaxy process or chemical vapor deposition. Preferably, the thickness of the conductive layer 24 is about 50 Å, the thicknesses of the dielectric layer 26 and the dielectric layer 32 are about 50 Å, and the thickness of the conductive layer 28 is about 100 Å.

In addition, after depositing the dielectric layer 26 and the dielectric layer 32 consisting of silicon nitride, it is contributive to reduce leakage current that uses hydrochloric acid as an oxidizing agent to oxidize the surface of the dielectric layer 26 and the dielectric layer 32 into silicon-oxy-nitride ($SiNO_x$) to form a double-layer structure consisting of silicon nitride/silicon-oxy-nitride. The dielectric layer 34 can be a silicon oxide layer formed by tetra-ethyl-ortho-silicate deposition or silicon nitride/silicon oxide (a double-layer structure).

Figure 4:
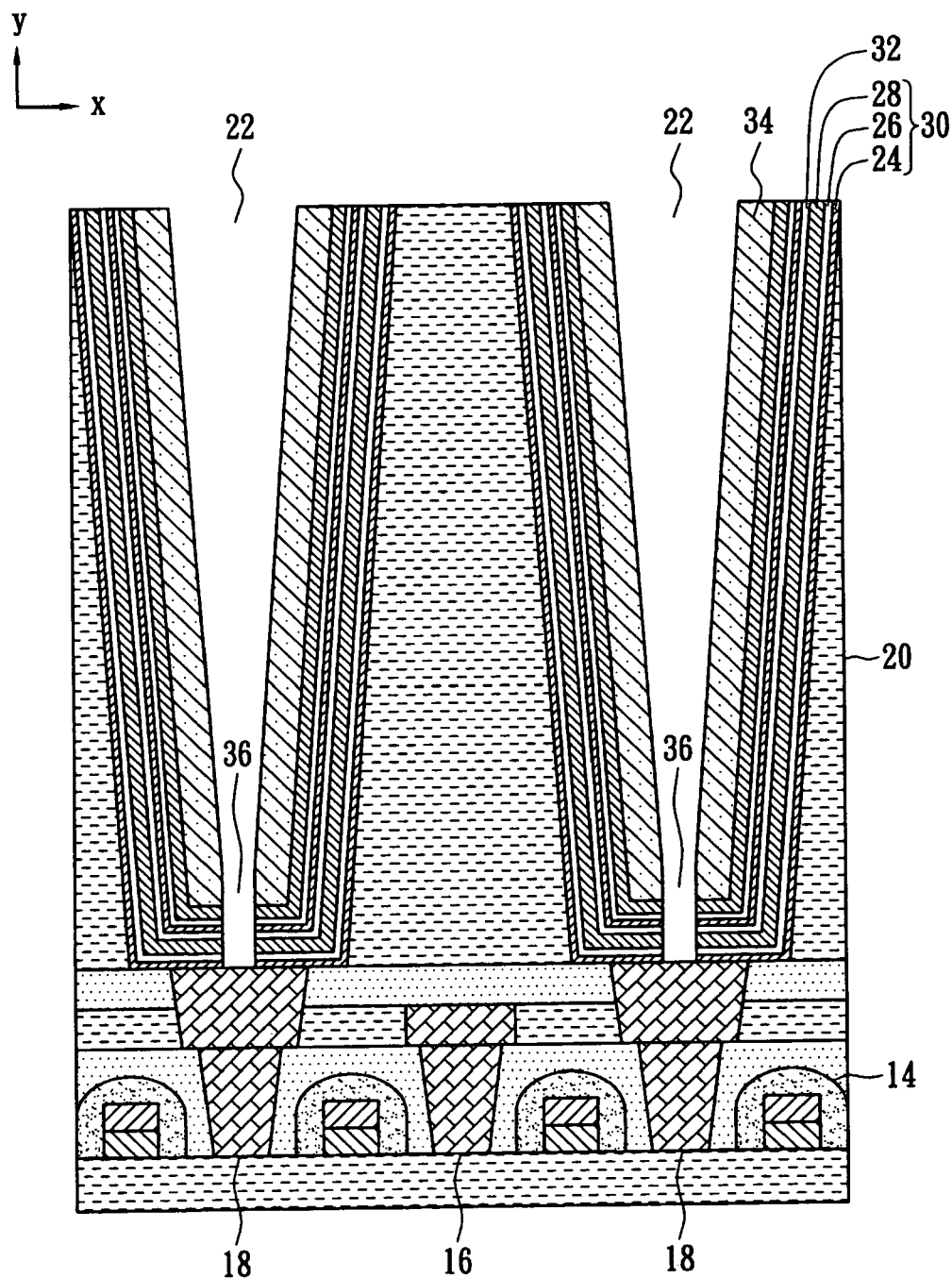
Figure 5:
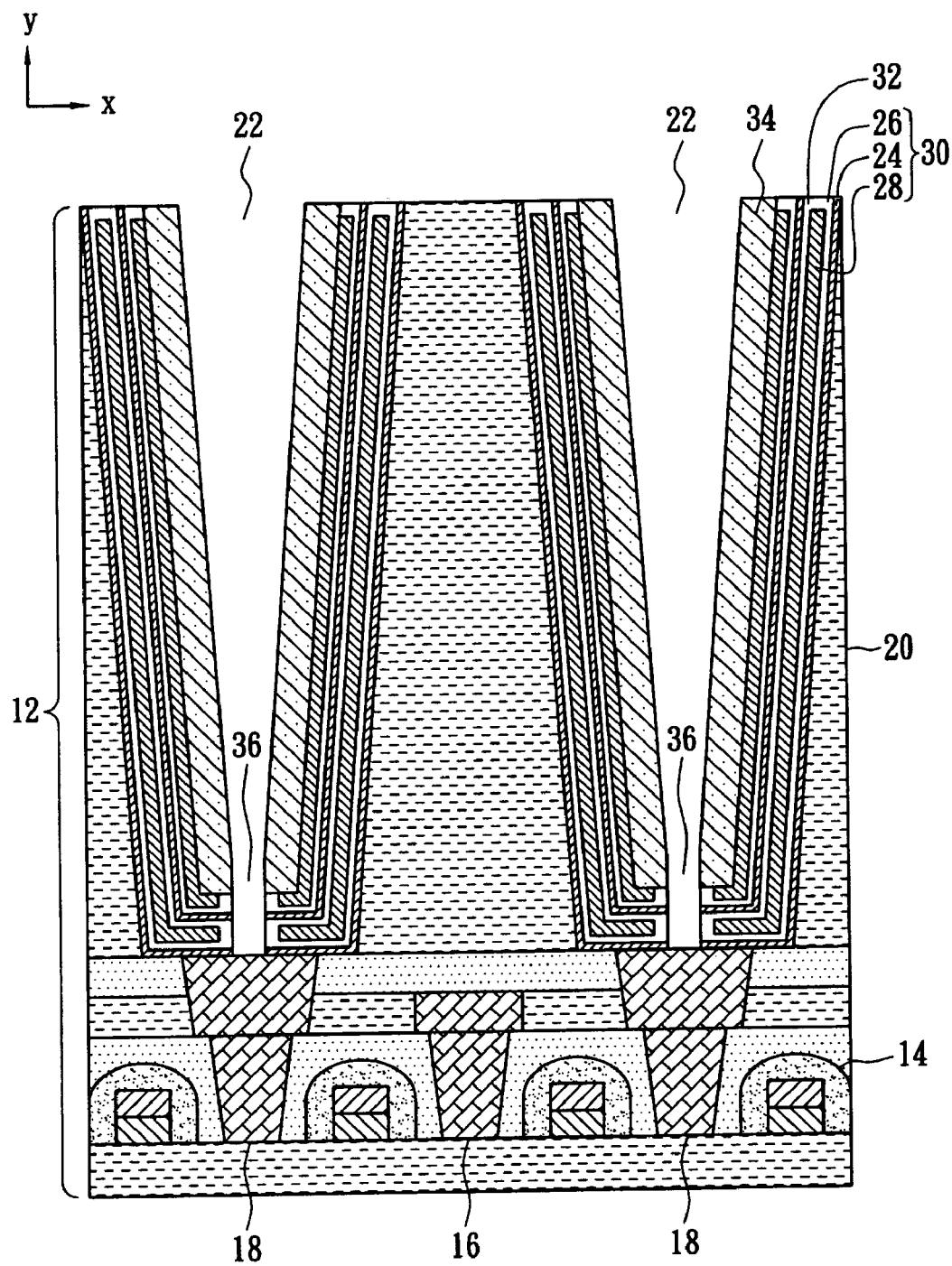

Referring to FIG. 4, an etching process is performed to remove a portion of the dielectric layer 34, the capacitive structure 30 and the dielectric layer 32 at the lower of the trench 22 to form an opening 36 down to the surface of the capacitor contact plug 18, i.e., the opening 36 is formed in the capacitive structure 30 inside the trench 22. The polysilicon of the conductive layer 28 is transformed into insulating silicon nitride in a nitrogen-containing atmosphere to isolate the conductive layer 28 exposed to the opening 36. Particularly, a portion of polysilicon of the conductive layer 28 exposed to the opening 36 and positioned on the surface of the substrate 12 will be transformed into silicon nitride composing the dielectric layer 26 and the dielectric layer 32, as shown in FIG. 5.

The etching process can be a dry etching process using carbon tetrafluoride and oxygen as etching gases, wherein the pressure in the reaction chamber is preferably about 60 mTorr, power about 100 W, and frequency 13.56 MHz. The thickness of the dielectric layer 34 in y direction is greater than that in x direction, and the dry etching can therefore remove the dielectric layer 34, the capacitive structure 30 and the dielectric layer 32 down to the surface of the capacitor contact plug 18, substantially without removing the dielectric layer 34 and the capacitive structure 30 from sidewalls of the trench 22. That is to say, the dry etching process forms the opening 36 in a self-aligned manner to expose the capacitor contact plug 18.

Figure 6:
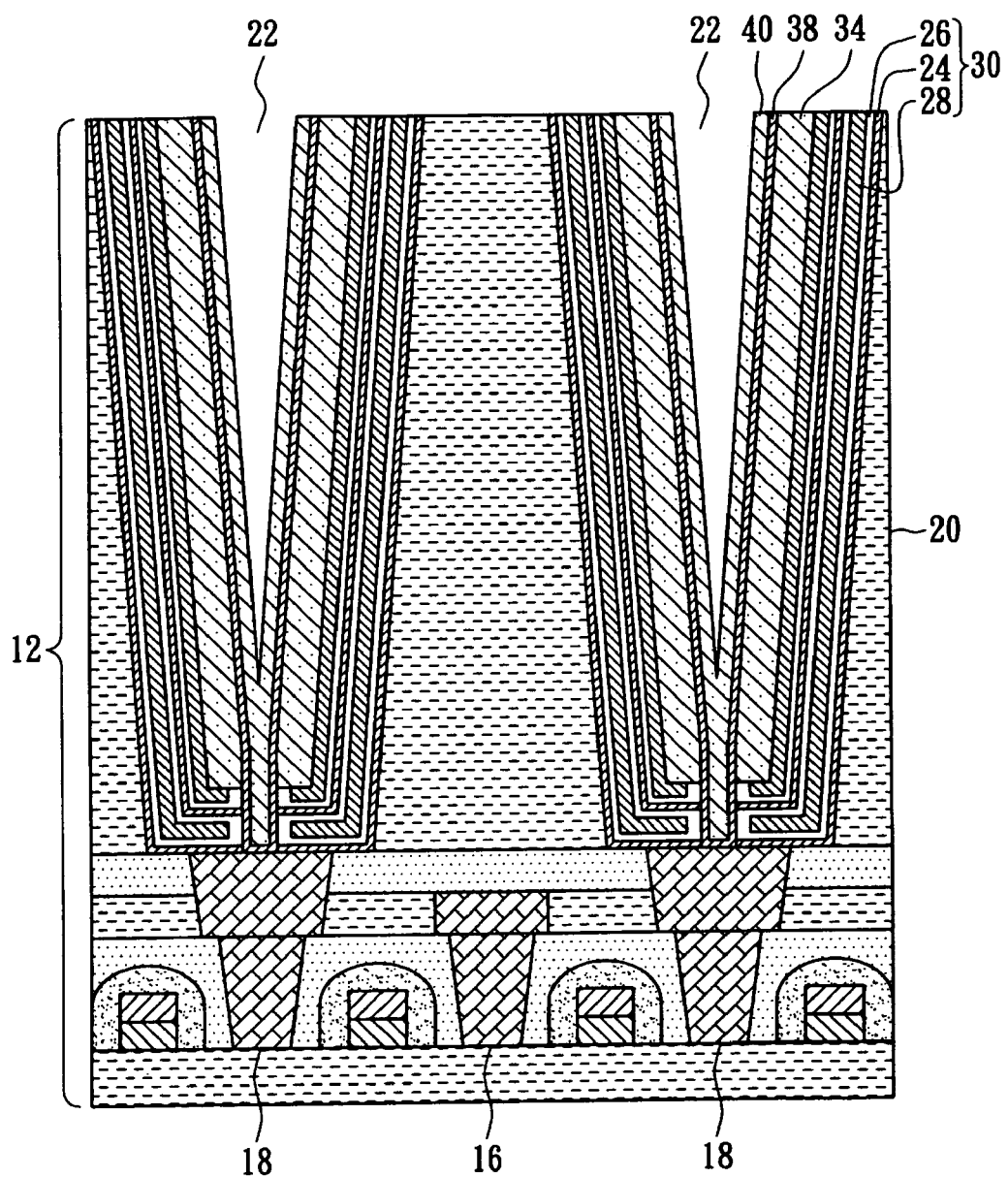

Referring to FIG. 6, a conductive layer 38 is deposited in the opening 32 and a dielectric layer 40 is subsequently deposited on the conductive layer 38. The conductive layer 38 in the opening 36 is electrically connected to the conductive layer 24 and the capacitor contact plug 18, and the dielectric layer 40 fills the opening 36. The conductive layer 38 is a titanium nitride layer formed by atomic layer deposition, and the dielectric layer 40 is made of tetra-ethyl-ortho-silicate. A chemical-mechanical polishing process is then performed to planarize the surface of the substrate 12.

Figure 7:
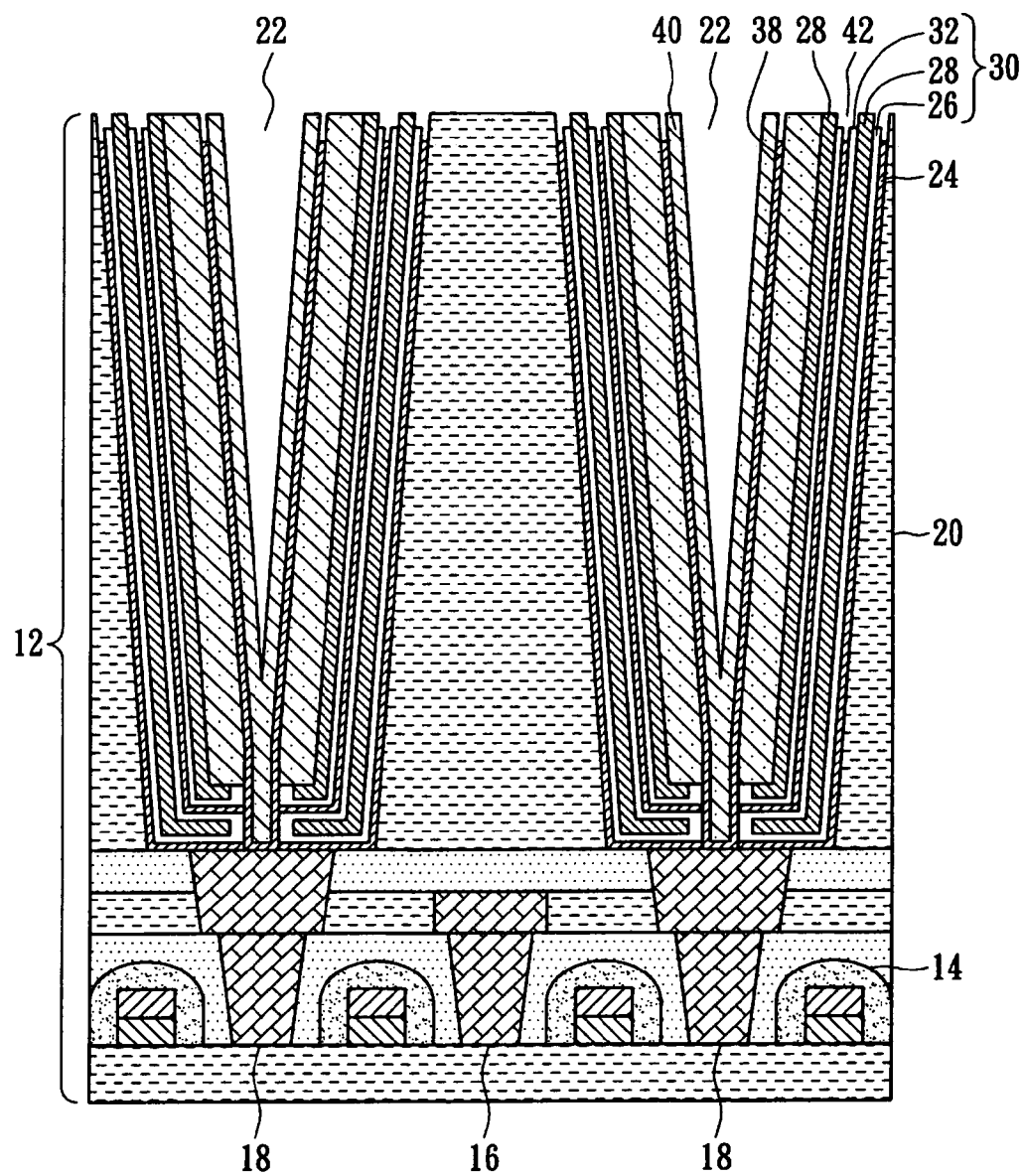

Referring to FIG. 7, a wet etching process is performed to remove a portion of the dielectric layer 28 and the dielectric layer 32 from the surface of the substrate 12, wherein the wet etching process uses phosphoric acid at 160° C. as etching solution to remove the silicon nitride composing the dielectric layer 28 and the dielectric layer 32. Another wet etching process is then performed to remove a portion of the conductive layer 24 and the conductive layer 38 consisting of titanium nitride from the surface of the substrate 12 to form a gap 42 between the conductive layer 28 consisting of polysilicon, wherein the etching solution used to etch the titanium nitride preferably comprises 22% of $(NH_4)_2Ce(NO_3)_6$ and 8% of acetic acid, and the reaction temperature is preferably about 20° C.

Figure 8:
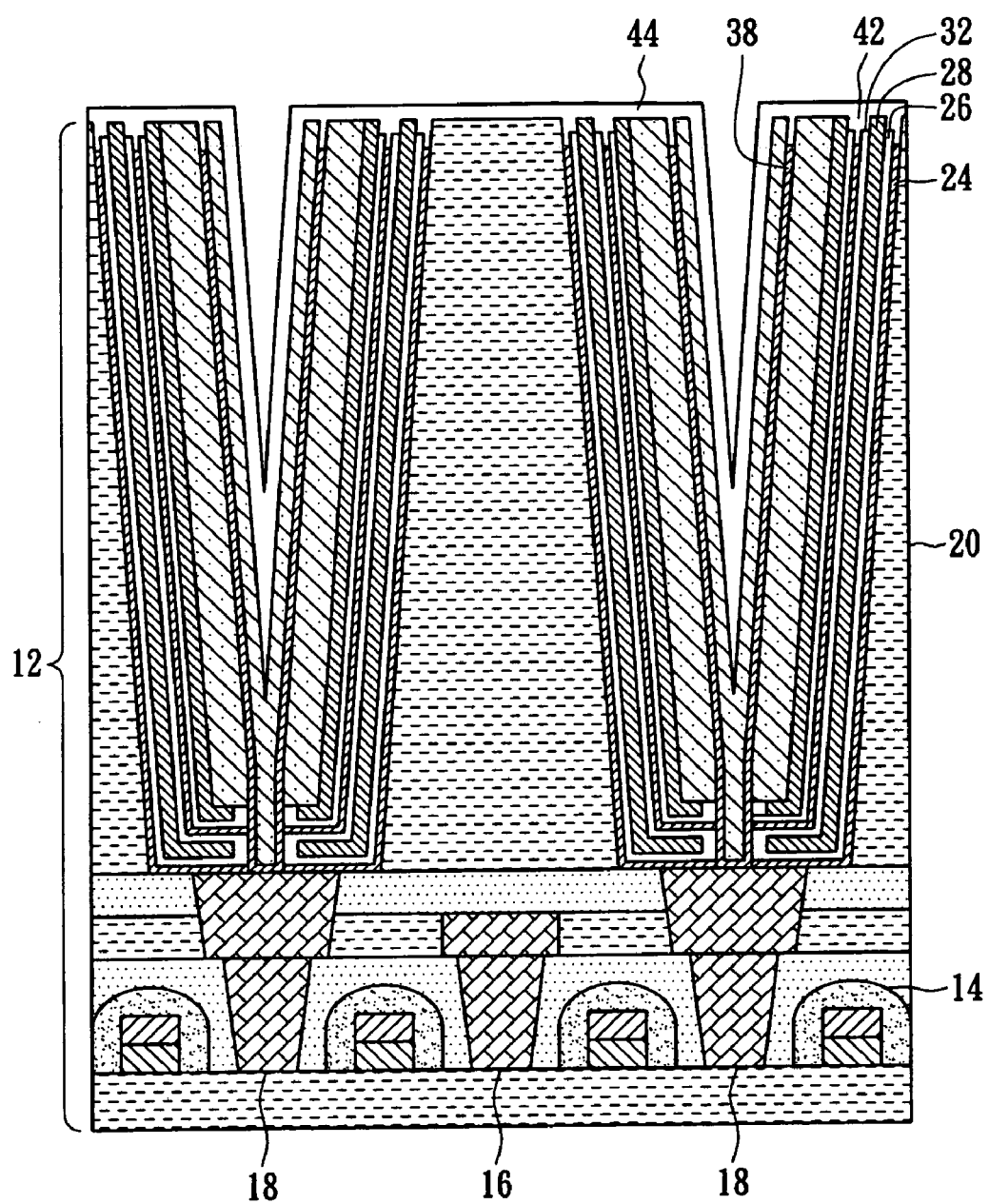

Referring to FIG. 8, a dielectric layer 44 is deposited on the surface of the substrate 12 and fills the gap 42, wherein the dielectric layer 44 is a silicon nitride layer formed by atomic layer deposition. A wet etching process or a planarization process is performed to remove the dielectric layer 44 from the surface of the substrate 12, while the dielectric layer 44 in the gap 42 is remained, as shown in FIG. 9. Removing the dielectric layer 44 from the surface of the substrate 12 exposes the conductive layer 28 consisting of polysilicon. In the contrary, the conductive layer 24 and the conductive layer 38 consisting of titanium nitride is not exposed since the dielectric layer 44 remaining in the gap 42 covers the conductive layer 24 and the conductive layer 38.

Referring to FIG. 10, a conductive layer 46 is deposited on the surface of the substrate 12 to electrically connect the conductive layer 28, wherein the conductive layer 44 is made of titanium nitride. A dielectric layer 48 is then deposited on the conductive layer 44 to complete the stacked capacitor 10, as shown in FIG. 11. The stacked capacitor 10 comprises an upper interdigital electrode 70, a lower interdigital electrode 60, and a dielectric material sandwiched between the upper interdigital electrode 70 and the lower interdigital electrode 60. The upper interdigital electrode 70 consists of the conductive layer 44 and the conductive layer 28, the lower interdigital electrode 60 consists of the conductive layer 38 and the conductive layer 24, and the dielectric material consists of the dielectric layer 26, the dielectric layer 32, the dielectric layer 34 and the dielectric layer 40. Preferably, the dielectric material sandwiched between the upper interdigital electrode 70 and the lower interdigital electrode 60 has a dielectric constant larger than or equal to 3.9. For example, the dielectric material can be silicon nitride, silicon oxide, aluminum oxide or titanium oxide.

Fingers of the upper interdigital electrode 70 can be made of polysilicon (the conductive layer 28) or aluminum, and fingers of the lower interdigital electrode 60 are made of titanium nitride (conductive layer 24) or titanium, i.e., the finger of the upper interdigital electrode 70 and the finger of the lower interdigital electrode 60 can be made of different conductive materials. Particularly, the body (the conductive layer 46) of the upper interdigital electrode 70 is made of titanium nitride or titanium, and the finger (the conductive layer 28) is made of polysilicon or aluminum, i.e., the body and the finger of the upper interdigital electrode 70 can be made of different conductive materials.

The above-described embodiments of the present invention are intended to be illustrative only. Numerous alternative embodiments may be devised by those skilled in the art without departing from the scope of the following claims.

What is claimed is:

1. A method for preparing a stacked capacitor, comprising steps of:
    forming a trench in a silicon substrate;
    forming a plurality of stacked capacitive structures on the substrate, wherein the stacked capacitive structure includes a first conductive layer, a first dielectric layer and a second conductive layer;
    forming an opening in the stacked capacitive structures in the trench;
    connecting the first conductive layers in the opening; and
    connecting the second conductive layers on the surface of the substrate.

2. The method for preparing a stacked capacitor of claim 1, wherein the first conductive layer is a titanium nitride layer formed by atomic layer deposition, the first dielectric layer is a silicon nitride layer formed by atomic layer deposition or chemical vapor deposition, and the second conductive layer is a polysilicon layer formed by an epitaxy process or chemical vapor deposition.

3. The method for preparing a stacked capacitor of claim 1, wherein the step of forming an opening in the stacked capacitive structure in the trench comprises steps of:
    depositing a second dielectric layer on the surface of the stacked capacitive structure in the trench; and
    performing an etching process to remove the second dielectric layer and the stacked capacitive structure from the bottom of the trench to form the opening.

4. The method for preparing a stacked capacitor of claim 3, wherein the etching process is a dry etching process using carbon tetrafluoride and oxygen as etching gases.

5. The method for preparing a stacked capacitor of claim 1, wherein the step of connecting the first conductive layer in the opening comprises steps of:
    isolating the second conductive layers in the opening; and
    forming a third conductive layer in the opening to electrically connect the first conductive layers.

6. The method for preparing a stacked capacitor of claim 5, wherein the second conductive layer is made of polysilicon, and the step of isolating the second conductive layers in the opening is performed in a nitrogen-containing atmosphere to transform polysilicon into silicon nitride.

7. The method for preparing a stacked capacitor of claim 1, wherein the step of connecting the second conductive layers on the surface of the substrate comprises steps of:
    exposing the second conductive layers on the surface of the substrate; and depositing a fourth conductive layer on the surface of the substrate to electrically connect the second conductive layers.

8. The method for preparing a stacked capacitor of claim 7, wherein the step of exposing the second conductive layer on the surface of the substrate comprises steps of:

removing the first dielectric layer and the first conductive layer from the surface of the substrate to form a gap between the second conductive layers;

depositing a third dielectric layer on the surface of the substrate to fill the gap; and removing the third dielectric layer from the surface of the substrate to expose the second conductive layer.

9. The method for preparing a stacked capacitor of claim 8, wherein the step of removing the first conductive layer is an etching process using an etching solution including cerium ammonium nitrate and acetic acid, and the step of removing the first dielectric layer is an etching process using phosphoric acid.

10. A method for preparing a stacked capacitor, comprising steps of:

forming a trench in a substrate;

forming at least one stacked capacitive structure on the substrate, wherein the stacked capacitive structure includes a first conductive layer, a first dielectric layer and a second conductive layer;

forming a second dielectric layer on the stacked capacitive structure;

forming an opening in the second dielectric layer and the stacked capacitive structure in the trench;

isolating the second conductive layer in the opening; and forming a third conductive layer on the second dielectric layer and in the opening.

11. The method for preparing a stacked capacitor of claim 10, wherein the first conductive layer is a titanium nitride layer formed by atomic layer deposition, the first dielectric layer is a silicon nitride layer formed by atomic layer deposition or chemical vapor deposition, and the second conductive layer is a polysilicon layer formed by an epitaxy process or chemical vapor deposition.

12. The method for preparing a stacked capacitor of claim 11, wherein the step of isolating the second conductive layer in the opening is performed in a nitrogen-containing atmosphere to transform polysilicon into silicon nitride.

13. The method for preparing a stacked capacitor of claim 10, wherein the step of forming an opening in the second dielectric layer and the stacked capacitive structure in the trench is a dry etching process using carbon tetrafluoride and oxygen as etching gases.

* * * * *